United States Patent [19]

Park et al.

[11] Patent Number: 4,477,310

[45] Date of Patent: Oct. 16, 1984

[54] PROCESS FOR MANUFACTURING MOS INTEGRATED CIRCUIT WITH IMPROVED METHOD OF FORMING REFRACTORY METAL SILICIDE AREAS

[75] Inventors: Hee K. Park, Portland; Tadanori Yamaguchi, Hillsboro, both of Oreg.

[73] Assignee: Tektronix, Inc., Beaverton, Oreg.

[21] Appl. No.: 522,885

[22] Filed: Aug. 12, 1983

[51] Int. Cl.³ .................. H01L 21/306; H01L 7/44; C23F 1/02; B05D 5/12
[52] U.S. Cl. .................................... 156/643; 29/571; 29/580; 148/187; 156/648; 156/653; 156/656; 156/662; 357/41; 357/47; 357/59; 427/88; 430/313
[58] Field of Search ............. 29/571, 580, 591, 576 R; 156/643, 648, 653, 656, 657, 659.1, 661.1, 662; 427/88-91, 86; 148/1.5, 187; 204/192 EC, 192 E; 430/313, 316, 317, 318; 357/41, 47, 48, 49, 50, 53, 59, 56, 65, 67, 71

[56] References Cited

U.S. PATENT DOCUMENTS

4,140,558  2/1979  Murphy et al. ............... 156/648 X
4,255,207  3/1981  Nicolay et al. ............... 148/174

*Primary Examiner*—William A. Powell
*Attorney, Agent, or Firm*—John Smith-Hill

[57] ABSTRACT

A CMOS integrated circuit made up of complementary insulated gate field effect transistors incorporates isolation trenches formed by a combination of thermal growth of silicon dioxide and chemical vapor deposition of polycrystalline silicon to prevent air gaps. Matching of the thermal coefficient of expansion of the trench with that of the substrate minimizes pn junction leakage currents as well as positive feedback latch-up operation. To reduce the ohmic contact resistance and interconnect resistance of the transistor elements, refractory metal silicide areas of low sheet resistance are contacted with the source, drain and gate elements. The process of manufacture also employs vertical walls of silicon nitride to prevent the formation of "birds' beak" portions of increased thickness in the silicon dioxide layer of each transistor, which could degrade the high frequency performance of the device.

7 Claims, 30 Drawing Figures

PROCESS FOR MANUFACTURING MOS INTEGRATED CIRCUIT WITH IMPROVED METHOD OF FORMING REFRACTORY METAL SILICIDE AREAS

BACKGROUND OF THE INVENTION

The subject matter of the present invention relates generally to the manufacture of integrated circuits, and in particular to a method of manufacture of a CMOS integrated circuit including a plurality of complementary insulated gate field effect transistors, and to the integrated circuit produced thereby. The method of manufacture of the present invention is especially useful to make high-speed and high-density integrated circuits having a frequency response of up to 400 megahertz and a density of up to 500,000 transistors per square centimeter. The resulting device is very large scale integration (VLSI) integrated circuit of high-speed.

It has been previously proposed in U.S. Pat. No. 4,356,211 of Riseman issued Oct. 26, 1982 to provide an integrated circuit of bipolar PN junction transistors with a dielectric isolation region of silicon dioxide formed in deep trenches. The trenches are etched by reactive ion etching through an epitaxial layer provided on the semiconductor substrate and contain oxidized polycrystalline silicon within the trench. Polycrystalline silicon is provided as two horizontally spaced layers on the opposite vertical sides of the trench. The vertical layers of polycrystalline silicon are thermally oxidized and caused to grow together across the width of the trench until they join at the top of the trench, thereby forming an air space within the polycrystalline silicon oxide filling of the dielectric isolation region. Thus, the top portion of the vertical layer of polycrystalline silicon on the wall of the trench is doped with an impurity so that it will oxidize at a faster rate than the lower portion of such vertical layer. As a result, the top portions grow together first to form a cap of silicon dioxide which seals the upper end of the trench before the lower portions of the vertical layer have grown together, thereby leaving a cavity or air space within the filling of polycrystalline silicon oxide forming the dielectric isolation region. This air space and silicon oxide isolation region causes defective operation of transistors especially when used in MOS insulated gate field effect transistor integrated circuits.

In addition, it has been found that by providing the dielectric isolation region of a CMOS integrated circuit in the manner of the present invention with filling of unoxidized polycrystalline silicon over a silicon dioxide layer coated on the entire inner surface of the trench, such isolation region has a thermal coefficient of expansion which more closely matches the silicon of the semiconductor substrate. This reduces thermal stress which tends to cause leakage currents at the edges of the PN junction which are adjacent the isolation region and also prevents positive feedback "latch-up" operation of the transistor. Thus, the method of manufacture of the present invention eliminates the air space and thermal stress problems of the Riseman patent.

It has been previously proposed by T. Shibata, et al in the article "An Optimumly Designed Process for Submicron MOSFETS", pages 647–650 of the IEEE Proceedings of the International Electron Device Meeting (IEDM) 1981, and by P. A. Gargini, et al in the article "WOS: Low Resistance Self-Aligned Source, Drain and Gate Transistors", pages 54–57 of the IEEE Proceedings of the International Electron Device Meeting (IEDM) 1981, to manufacture CMOS transistors having refractory metal silicide areas provided on the source, drain and gate elements of the transistor to lower the ohmic contact resistance and the interconnect resistance of such elements. However, in the Shibata article, the refractory metal employed to form the silicide areas is platinum which is of too high resistivity and is too expensive. In the Gargini article, the tungsten used as the refractory metal to form the silicide is also of relative high resistivity. In addition, Gargini uses chemical vapor deposition to deposit the tungsten on the silicon at sufficiently high temperatures to form tungsten silicide simultaneously with the deposition of the tungsten. However, this has the disadvantage that the tungsten is deposited with a non-uniform thickness so that the tungsten silicide coating is not reproducible in production integrated circuits.

In order to overcome these problems, the method of manufacture of the present invention employs a process employing titanium or tantalum as the refractory metal which forms the refractory metal silicide with the silicon of the source and drain and with the polysilicon of the gate. Titanium and tantalum have the advantage that they have a much lower sheet resistance on the order of 2 to 3 ohms per square, which is less than half the 5 to 8 ohms per square sheet resistance of platinum and tungsten. However, titanium and tantalum have the disadvantage that they readily form an oxide which is very difficult to remove by etching as is required for those refractory metal portions on the silicon dioxide layer which do not form a silicide. This oxidation problem is overcome in the present invention by using a double layer of two different refractory metals including an outer layer of a refractory metal such as molybdenum which does not readily oxidize during silicidation as a protective layer over the inner layer of titanium or tantalum to prevent oxidation of such inner layer. This has the advantage that the portions of the refractory metal inner layer which do not form a silicide and the entire outer layer can be selectively removed by etching refractory metal silicide on the source, drain and gate elements of the MOS field effect transistor. Siliciding is performed in two steps including a first silicidation at low temperature of about 600° C. to prevent the silicon dioxide layer from forming a silicide with the inner layer of refractory metal. After selectively etching to remove the refractory metal on the silicon dioxide layer of the insulated gate which does not form a silicide, the device is again heated but to a higher temperature of about 800° C. for further silicidation on the source, drain and gate elements to reduce the sheet resistance to approximately 2 to 3 ohms per square.

Another advantage of the method of manufacture of the present invention is the prevention of the formation of a "bird's beak" portion of greater thickness in the silicon dioxide insulation layer of the insulated gate field effect transistor. Bird's beak formation is the result of lateral diffusion of the oxygen atoms during thermal growth of the silicon dioxide isolation regions surrounding the field effect transistors and reduces the density of transistors formed in the integrated circuit. Such a bird's beak, also, reduces the effective width of the channel portion of the field effect transistor and, therefore, deleteriously effects its performance. Bird's beak formation is prevented by providing a silicon nitride side wall cover layer extending over the vertically sides at the opposite ends of the silicon oxide insulating layer forming the insulated gate. The silicon nitride side wall prevents lateral diffusion of the oxygen atoms of such insulating layer, thereby stopping the growth of any bird's beak portion. The silicon nitride side walls are joined to a silicon nitride top layer over the upper surface of the silicon dioxide insulating layer to form a protective "nitride cup" which prevents any increase in thickness of the gate insulating layer during subsequent heat treatment.

SUMMARY OF INVENTION

One object of the present invention is to provide an improved integrated circuit and method of manufacture for producing integrated circuits of high-frequency response and high-density transistor population.

Another object of the invention is to provide such an integrated circuit and method of manufacture with improved dielectric isolation regions whose thermal coefficient of expansion more closely matches that of the semiconductor substrate in order to reduce thermal stress and thereby prevent PN junction leakage currents and to prevent positive feedback latch-up operation of insulated gate field effect transistors in such integrated circuits.

A further object of the invention is to provide such integrated circuit and method of operation in which the dielectric isolation region is formed with deep trenches separating a pair of transistors, such trenches having their inner surfaces coated with semiconductor oxide and being provided with a filling of unoxidized polycrystalline semiconductor material which completely fills the coated trenches to prevent the formation of air gaps in the isolation region.

An additional object of the invention is to provide such an improved integrated circuit and method of manufacture in which insulated gate field effect transistors therein are provided with refractory metal silicide areas of low sheet resistance in contact with the source, drain and gate elements of such transistor to reduce the ohmic contact resistance and the interconnect resistance of such elements.

Still another object of the invention is to provide such a method of manufacture in which the refractory metal silicide layer is formed by depositing two refractory metal layers including an inner layer of low resistance metal, such as titanium or tantalum, which forms the silicide and an outer layer of a non-oxidizing refractory metal, such as molybdenum, which prevents oxidation of the inner layer to enable the portions of the inner layer which do not form a silicide to be selectively removed by etching to leave self-aligned silicide areas on only the source, drain and gate elements of the transistor.

A still further object of the invention is to provide such a method of manufacture which prevents the formation of a "bird's beak" portion of increased thickness in the silicon oxide layer on such transistor to provide improved insulated gate field effect transistors of wider effective channel elements for better high-frequency performance while providing a high-density integrated circuit.

A still additional object of the invention is to provide such a method of manufacture in which silicon nitride side walls are provided over the vertical ends of the silicon oxide insulating layer to prevent lateral diffusion of the oxygen atoms, thereby stopping bird's beak growth in the oxide layer.

DESCRIPTION OF DRAWINGS

Other objects and advantages of the present invention will be apparent from the following detailed description of preferred embodiments thereof and from the attach graw of which.

DESCRIPTION OF PREFERRED EMBODIMENTS

Figure 1A:
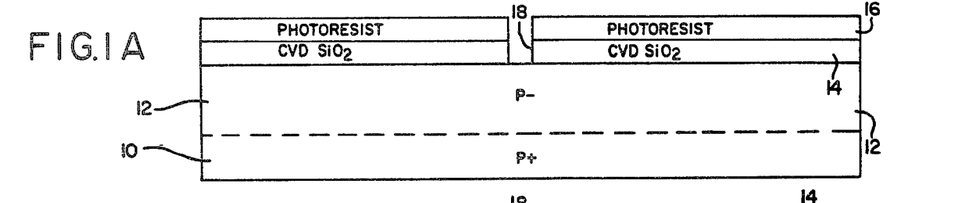
FIGS. 1A to 1H, 1J to 1N and 1P show successive steps of a first process used in the method of manufacture of the integrated circuit of the present invention to form dielectric isolation regions with deep trenches coated with a silicon oxide layer and having a filling of unoxidized polycrystalline silicon contained within the coated trench.

As shown in FIGS. 1A to 1H, 1J to 1N and 1P, one method of manufacture of a CMOS integrated circuit in accordance with the present invention includes a first process for forming dielectric isolation regions in deep trenches to separate each pair of complementary insulated gate field effect transistors from each other. The proess for forming the dielectric isolation region includes the following steps illustrated in FIG. 1A. First, substrate 10 of P+ type monocrystalline semiconductor material, such as silicon, having a resistivity of about 0.008 ohm-centimeters is provided with an epitaxial layer 12 of monocrystalline silicon on its upper surface, such epitaxial layer having a thickness of about 3 to 4 microns and a resistivity of about 40.0 ohm-centimeters. The substrate and epitaxial layer may be oriented with crystal lattice plane <100> located at the top surface thereof. An oxide layer 14 of silicon dioxide ($SiO_2$) of approximately 10,000 angstroms thickness is deposited on the upper surface of the epitaxial layer 12 in a conventional manner by chemical vapor deposition (CVD). Next, a photoresist layer 16 is coated over the top of the oxide layer 14, exposed to a light pattern and developed to form an etching mask by conventional photolithographic techniques. Thus, the photoresist mask has mask openings 18 through the photoresist layer to the upper surface of the oxide layer 14. A portion of the silicon dioxide layer 14 is removed beneath the opening 18 by etching through the oxide layer in a conventional manner, such as by reactive ion etching. As a result, the etched silicon dioxide layer 14 with openings 18 therethrough is produced to provide an oxide mask for etching the epitaxial layer 12 to form a dielectric isolation region.

Figure 1B:
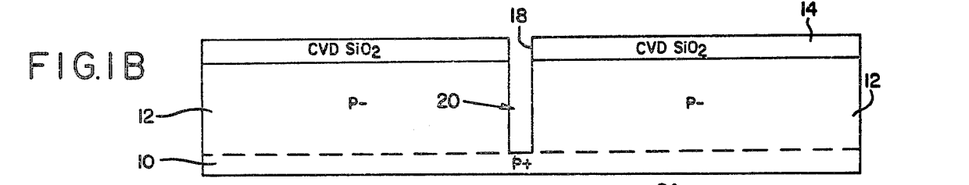

FIG. 1B shows the next steps of the first process including completely removing the photoresist layer 16 and then etching through mask opening 18 to provide a deep trench 20 extending completely through the epitaxial layer 12 and in alignment with the mask opening. The deep trench 20 about 2 microns wide and 6 microns deep is formed by reactive ion etching using a plasma gas of either $CCl_4+Cl_2$ gas or $SiCl_4+SF_6$ gas in order to anisotropically etch the epitaxial layer 12 and a portion of the substrate 10 to provide substantially vertical straight sides for the trench. Reactive ion etching is discussed in U.S. Pat. No. 4,356,211 of Riseman.

Figure 1C:
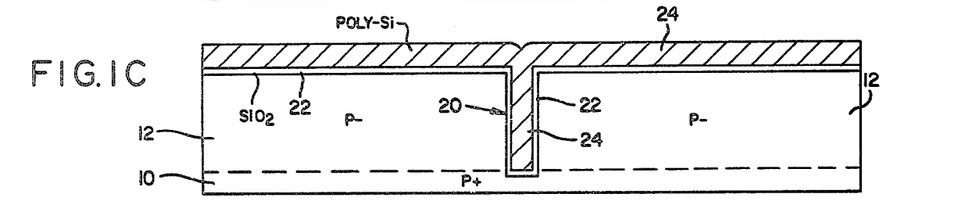
Figure 1D:
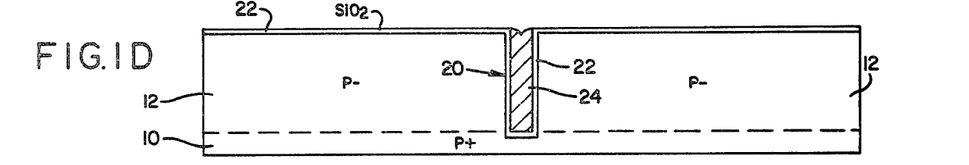
Figure 1E:
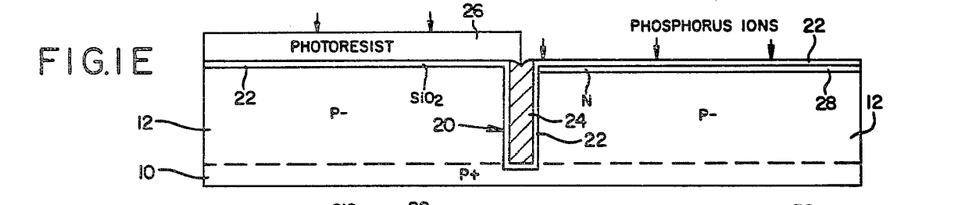

As shown in FIG. 1C the silicon dioxide layer 14 contaminated with impurities is removed by etching after the trench 20 is formed. Next a layer 22 of silicon dioxide about 500 angstroms thick is formed on the surface of the epitaxial layer 12, and on the surfaces of the trench 20 including the side and bottom surface thereof. The oxide layer 22 is produced by heating the semiconductor device in oxygen at a temperature of approximately 1000° C. in order to oxidize the surfaces in question, hereafter called "thermal growth" of oxide. Then, a layer of polycrystalline silicon 24 is deposited by chemical vapor deposition in a conventional manner on the surface of the thin silicon dioxide layer 22 to completely fill the trench with a filling of unoxidized polycrystalline silicon. The polycrystalline silicon filling 24 within trench 20 prevents the formation of any air spaces in the trench as are produced by the method of the Riseman U.S. Pat. No. 4,356,211 discussed above. It should be noted that the unoxidized polycrystalline silicon has a high resistivity on the order of about $10^{+10}$ to $10^{+11}$ ohm-centimeters because it is not doped with conductivity doping impurities, but is of lower resistivity than the insulating material of the thin silicon dioxide layer 22 which has a resistivity of about $10^{+14}$ ohm-centimeters. As shown in FIG. 1D, the polycrystalline silicon layer 24 is removed from the upper surface of the epitaxial layer 12 by reactive ion etching down to the surface of the thin silicon dioxide layer 22. Next in FIG. 1E, a photoresist layer 26 is deposited and photolithographically processed to produce an etch mask from the portion of the epitaxial layer 12 and oxide layer 22 to the left of the isolation trench 20 with mask openings over the portion of the epitaxial layer and oxide layer to the right of the trench. Then an N— type layer 28 is formed in the surface of the epitaxial layer portion to the right of the trench by implanting phosphorous ions or other N type impurities through the photoresist mask opening into the epitaxial layer 12 in a conventional manner such as by ion bombardment implantation. Thus, the phosphorous ions convert the semiconductor material of the epitaxial layer 12 from a P— type to N type conductivity in layer 28.

Figure 1F:
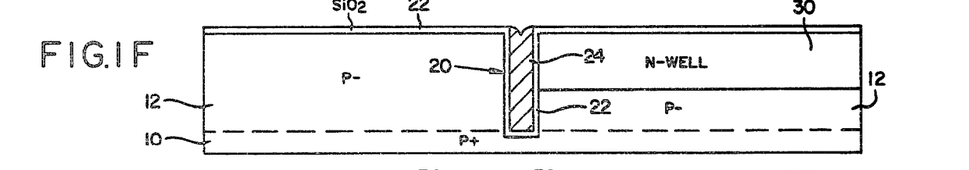

As shown in FIG. 1F, after the photoresist layer 26 is removed, N type layer 28 is diffused to a greater thickness by heat treatment to form an N type well region 30. This N type well region 30 will be used as the channel portion of an enhancement type P conductivity channel insulated gate field effect transistor which is positioned to the right of the isolation trench 20. However, the P— portion of the epitaxial layer 12 to the left of the trench 20 forms an N conductivity channel insulated gate field effect transistor as shown in FIG. 1P hereafter described. Thus, the dielectric isolation region formed in the trench 20 by the silicon dioxide layer 22 and the polycrystalline silicon filling 24, separates a pair of complementary N channel and P channel field effect transistors.

Figure 1G:
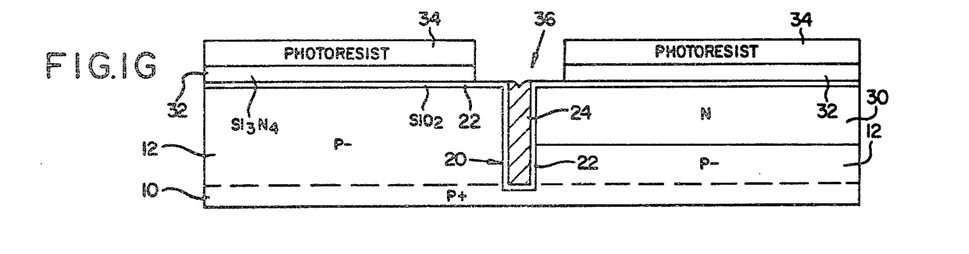

The process continues in FIG. 1G including the step of chemical vapor deposition of a silicon nitrid $Si_3N_4$ layer 32 with a thickness of about 1500 angstroms on the upper surface of the silicon dioxide layer 22. Next, a layer 34 of photoresist is deposited on the upper surface of the silicon nitride layer 32 and is provided with a mask opening 36 therethrough over the trench 20 in a conventional manner. The silicon nitride layer 32 is then etched by reactive ion etching in a conventional manner with $CF_4+O_2$ gas using a D.C. voltage field and an A.C. voltage radio frequency field in order to produce a plasma of etching gas ions which remove the portion of the silicon nitride layer in alignment with mask opening 36.

Figure 1H:
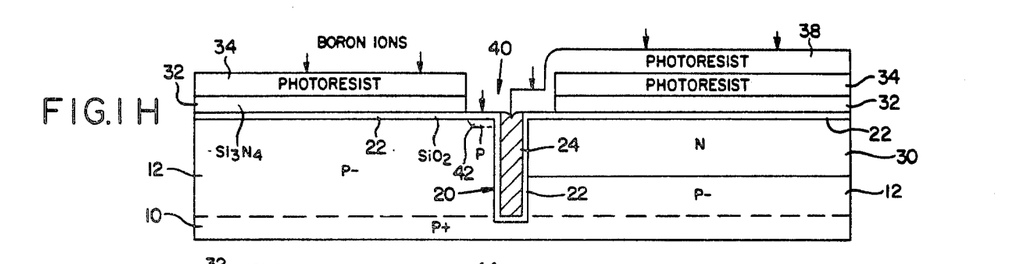
Figure 1J:
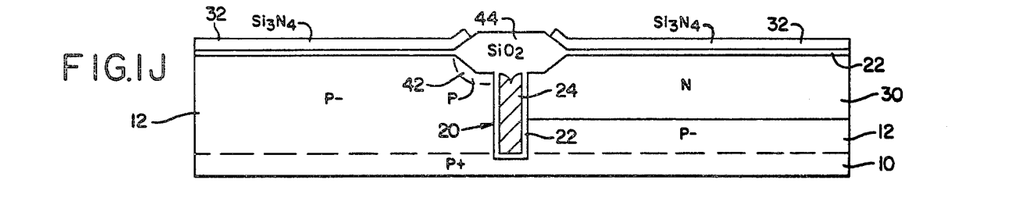

As shown in FIG. 1H, a second photoresist layer 38 is deposited by conventional photolithographic techniques over the portion of the first photoresist layer 34 to the right of the trench 20 as well as over the exposed portion of the silicon dioxide layer 22 and the polycrystalliine silicon filling 24 to the right of the center of the trench. Thus, a mask opening 40 is created between the left end of the second photoresist layer 38 and the right end of the first photoresist layer 34 in the space to the left of the center of trench 20. A field region 42 of P type material is implanted by ion bombardment of boron impurity atoms through the mask opening 40 into the upper right hand corner of the portion of epitaxial layer 12 to the left of the trench 20. As shown in FIG. 1J, in the next step the photoresist layers 34 and 38 are removed and the portions of the silicon dioxide layer 22 on opposite sides of the trench 20 including that above the field region 42 are increased in thickness by thermal growth to merge with additional oxide regions 44 provided over the trench filling 24 by heating in oxygen for further oxidation of approximately 1000° C. It should be noted that undesirable "birds's beak" shaped ends of tapered thickness are formed on oxide regions 44 due to lateral diffusion of the oxygen atoms from the oxide layers 22.

Figure 1K:
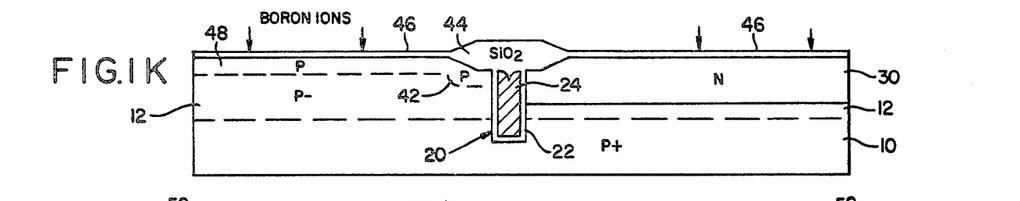

As shown in FIG. 1K, the silicon nitride layer 32 is removed by etching and the silicon dioxide layers 22 above the N well region 30 and above the left portion of the epitaxial layer 12 are also removed by etching in order to eliminate contaminated silicon dioxide material. A gate oxidation layer 46 of silicon dioxide is then formed by thermal growth oxidation over the N well region 30 and the upper surface of the left hand portion of the epitaxial layer 12. This gate oxidation layer 46 is formed by heating the silicon in oxygen at a temperature of approximately 1000° C. Next, a P channel region 48 is formed by ion bombardment implanting boron or other P type impurities into the upper surface of the left portion of the epitaxial layer 12 to the left of the trench 20. The P channel region 48 merges with the field region 42, also, of P type material. It should be noted that the boron impurity is not of sufficient concentration to change the type of conductivity of the N type well region even though boron ions are also implanted therein.

Figure 1L:
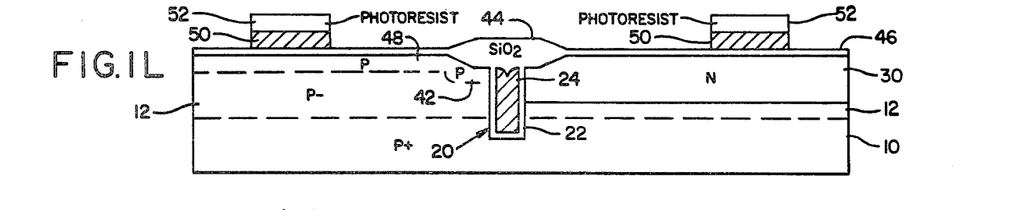

Next, as shown in FIG. 1L, a layer of polycrystalline silicon 50 is deposited by chemical vapor deposition on the upper surface of the oxide layer 46 and is then doped by vapor deposition of phosphorous or other N type impurity to provide a N+ polycrystalline silicon material which is diffused throughout the layer 50 by heating in a "thermal drive" step. Next, those portions of the layer 50 which are not used as the gate element of the transistor are removed by etching. Thus, a photoresist layer 52 is deposited over the polysilicon layer 50 and a mask is formed from such photoresist layer by conventional photolithographic techniques. The polycrystalline silicon layer is etched away in those not covered by the photoresist mask, leaving the gate polysilicon gate element 50.

Figure 1M:
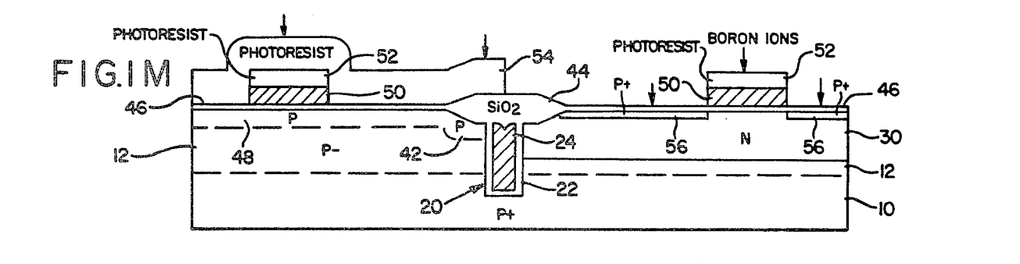

As shown in FIG. 1M, another photoresist layer 54 is provided over the polysilicon gate 50 and first photoresist layer 52 positioned to the left of the trench 20 as well as over the oxide layer 46 and field oxide region 44 extending to the left from the center of such trench. The photoresist layer 54 is formed into a mask by conventional photolithographic techniques to provide a mask opening over the N well region 30 to the right of the trench 20. Source and drain P+ regions 56 are implanted through such mask opening into the N well region by ion bombardment with boron ions to form two spaced P+ regions on opposite sides of the polysilicon gate 50. The gate 50 and overlying photoresist layer 52 to the right of the trench mask the center of the N well region to enable the two spaced P+ regions 56 to be formed in the well region. These P+ regions 56 will be used to form the source and drain elements of the insulated gate field effect transistor positioned to the right of trench 20.

Figure 1N:
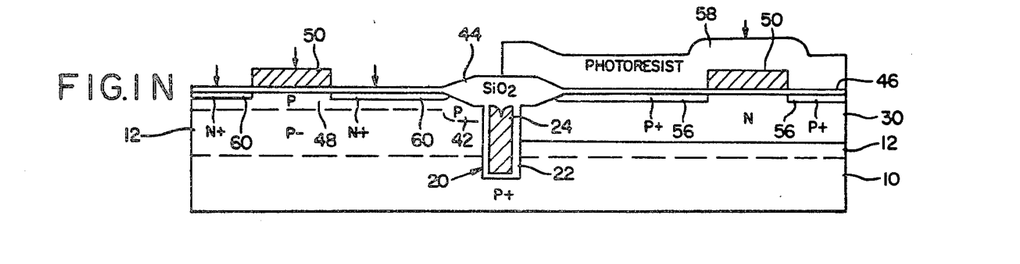
Figure 1P:
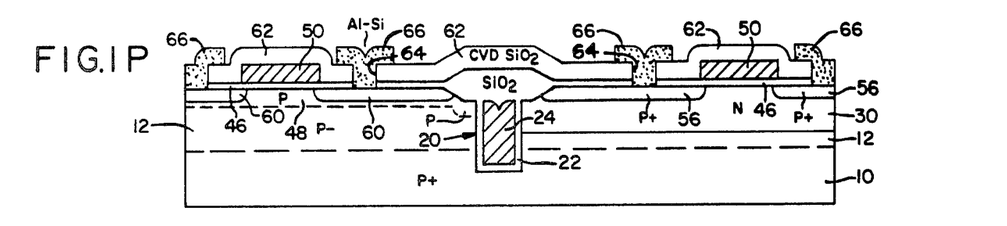

As shown in FIG. 1N, photoresist layer 54 on the left side of trench 20 and photoresist layer 52 on both sides of trench 20 are then removed. Another photoresist layer 58 is deposited over the polysilicon gate 50 positioned to the right of trench 20 as well as over the oxide layer 46 and field oxide region 44 extending to the right from the center of such trench. Photoresist layer 58 is formed into a mask to provide an opening over the p channel region 48 to the left of trench 20. Source and drain regions 60 are then implanted through such mask opening into the p channel region by ion bombardment with an N-type impurity to form two spaced N+ regions on opposite sides of the polysilicon gate 50. The gate 50 to the left of trench 20 masks the center of p channel region 48 to enable the two spaced N+ regions 60 to be formed in the p channel region. These N+ regions 60 will be used to form the source and drain elements of the unsulated gate field effect transistor positioned to the left of trench 20. FIG. 1P shows the final steps in the process for forming an integrated circuit with a deep trench isolation region filled with unoxidized polycrystalline silicon 24. The photoresist layer 58 is removed and then additional silicon dioxide layers 62 are provided over the gate regions 50 for passification and over the oxide layer 44. The integrated circuit is then heated for annealing purposes. This annealing causes further diffusion of the P+ implantation regions 56 and the N+ implantation regions 60 to increase the thickness of these source and drain regions. Contact apertures 64 are formed through the silicon oxide layer 62 and the gate oxide layers 46 by conventional photoresist masking and photolithographic techniques. An aluminum-silicon alloy contact region 66 is deposited through each contact opening 64 by sputtering to provide ohmic contacts with the source and drain regions 56 and 60 in the N well layer 30 and the source and drain regions 60 in the expitaxial layer region 12 to the left of the trench 20. Then the photoresist layer used to form the ohmic contact deposition region 66 is removed and the entire integrated circuit is again heated for annealing to insure that the ohmic contacts 66 form good electrical contact with the source and drain portions of the field effect transistors. It should be noted that additional ohmic contacts (not shown) are formed in contact with the gate regions 50 of the two complementary field effect transistors by photoresist etching of contact openings (not shown) through the silicon dioxide layer 62 above such gate regions simultaneously with the formation contacts 66. However, this has been omitted for purposes of greater clarity.

This completes the process for forming a CMOS integrated circuit including a plurality of pairs of complementary insulated gate field effect transistors, each pair of complementary transistors being separated by a dielectric isolation region formed by unoxidized single crystalline silicon 24 provided on silicon dioxide layer 22 within the deep trench 20 extending through the epitaxial layer 12. The advantage of the polycrystalline silicon filling 24 in such isolation region is to provide it with a thermal coefficient of expansion more nearly matching that of the semiconductor substrate 10. This results in a reduction of thermal stress which reduces PN junction leakage current around the edge of the PN junction formed between the N well region 30 and the epitaxial layer region 12 adjacent the isolation region. In addition, this prevents positive feedback "latch-up" which is a defective operation of the transistors. It should be noted that by using reactive ion etching to form the trench 20, the opposite sides of the trench are substantially vertical and are provided with a positive slope so that such sides slope continuously slightly outward with increasing distance from the bottom of the trench. As a result, when the polycrystalline silicon filling 24 is deposited within the coated trench having its inner surfaces, including the bottom surface thereof coated with the silicon dioxide layer 22, no air spaces are formed within the polycrystalline silicon filling 24. This lack of air spaces further reduces thermal stress.

A second process for producing self-aligned silicide regions of low sheet resistance in contact with the source, drain and gate elements of insulated gate transistors in a CMOS integrated circuit produced by the method of manufacture of the present invention is shown in FIGS. 2A to 2H.

Figure 2A:
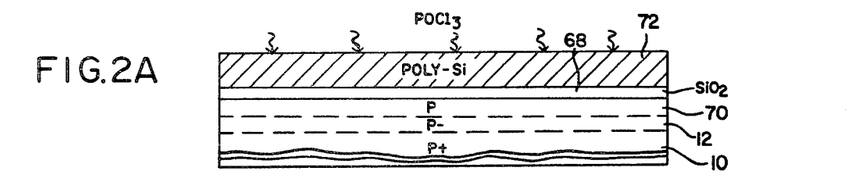
FIGS. 2A to 2H show successive steps of a second process used in the method of manufacture of the integrated circuit of the present invention to form self-aligned refractory metal silicide areas on the source, drain and gate elements of the transistors.

As shown in FIG. 2A, the substrate 10 of P+ type silicon semiconductor material having an epitaxial layer 12 of P− type silicon semiconductor material may also be employed in this second process. The upper surface of the epitaxial layer 12 is first coated with a gate insulation layer 68 of silicon dioxide, in any suitable manner such as by thermal growth oxidation in which the substrate is heated in oxygen to a temperature of about 1000° C. Next, a channel region 70 of P type semiconductor material is produced in the epitaxial layer 12 by implantation of boron or other P type impurities in a conventional manner, such as by ion bombardment. Then a polycrystalline silicon layer 72 is deposited on the upper surface of the gate insulation layer 68 by chemical vapor deposition. The polycrystalline silicon layer 72 may have a thickness of approximately 5,000 angstroms, and is doped with phosphorous impurity to provide N+ conductivity. Doping may be provided by chemical vapor deposition from POCl$_3$ gas and diffusion at 930° C. into the upper surface of layer 72 to provide the gate region of an insulated gate semiconductor device.

Figure 2B:
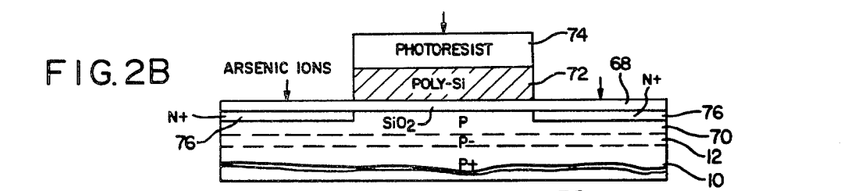

As shown in FIG. 2B, a photoresist layer 74 is provided on the upper surface of the polycrystalline silicon layer 72 and using conventional photolithographic techniques is exposed to a light pattern and developed to provide a photoresist etching mask. Then the polycrystalline silicon layer 72 is etched through the mask 74 by reactive ion etching to remove part of such layer leaving the gate region 72 shown in FIG. 2B. Next, N+ source and drain regions 76 are formed in the upper surface of the channel layer 70 by ion implantation of arsenic ions through the insulation layer 68 on opposite sides of the gate region 72 which serves as a mask for such implantation.

Figure 2C:
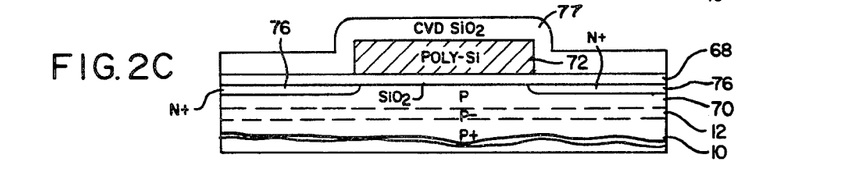
Figure 2D:
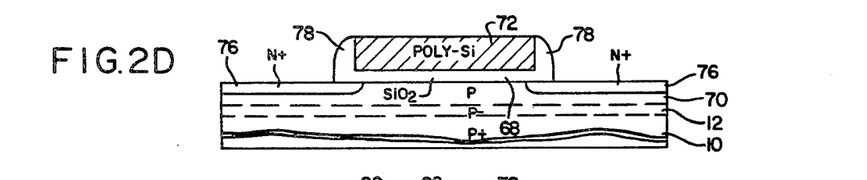

As shown in FIG. 2C, the photoresist layer 74 is removed and an oxide layer 77 of chemically vapor deposited silicon dioxide is deposited on the upper surface of the polycrystalline silicon gate region 72 and on the upper surface of the gate insulation layer 68 on opposite sides of such gate region. Then the coated device is heated for annealing the ion bombardment surfaces of the source and drain regions 76. As shown in FIG. 2D, the oxide layer 77 is removed by reactive ion etching except for oxide side wall portions 78 which extend over the vertical side walls at the opposite ends of the polycrystalline silicon gate region 72. It should be noted that this reactive ion etching also removes the portions of the gate insulation layer 68 on opposite sides of the gate region above the source and drain regions 76.

Figure 2E:
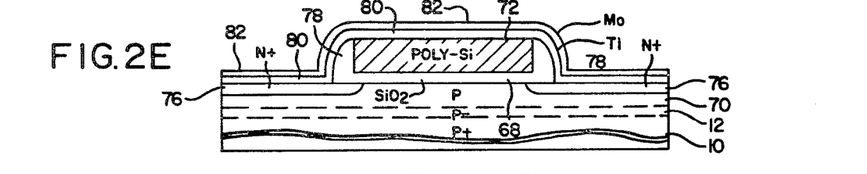

As shown in FIG. 2E, an inner layer 80 of refractory metal of low resistivity, such as titanium or tantalum, which forms a silicide with the silicon is deposited by evaporation or sputtering over the upper surface of the polycrystalline silicon gate region 72, the oxide side walls 78 and the gate source and drain regions 76. The inner layer of refractory metal has a low resistivity on the order of 2 to 3 ohms per square. An outer layer of refractory metal 82 which does not readily oxidize is provided over the inner layer 80 in order to prevent oxidation of such inner layer so that those portions of the inner layer on the silicon oxide side walls 78 may be removed by etching which is not possible if $TiO_2$ or $TaO_2$ is formed. The refractory metal of the outer layer 82 may be platinum, tungsten or molybdenum which are of a higher resistivity than the inner layer and does not readily oxidize. In a preferred example, the inner layer 80 is of titanium, while the outer layer 82 is of molybdenum.

Figure 2F:
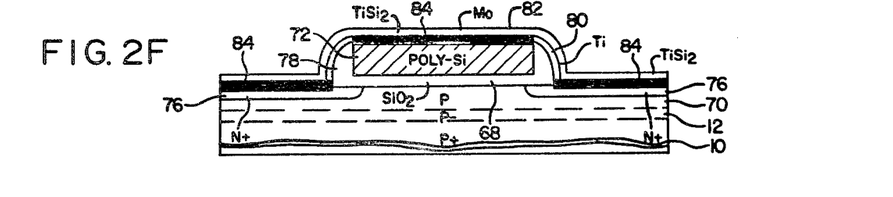

As shown in FIG. 2F, the process next follows a low temperature silicidation step which causes the titanium of the inner layer 80 to form titanium silicide ($TiSi_2$) areas 84 on the upper surface of the polycrystalline silicon gate region 72 and on the top of the source and drain regions 76 by reacting with the silicon of such regions. This low temperature silicidation is achieved by heating the coated semiconductor device to approximately 600° C. for 30 minutes in inert atmosphere of hydrogen and nitrogen. Also, the low temperature prevents any silicide from forming on the silicon dioxide side walls 78.

Figure 2G:
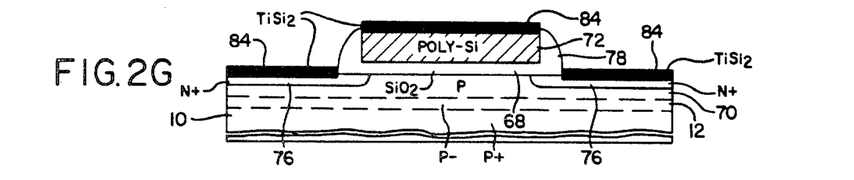

After the low temperature silicidation step of FIG. 2F, the outer layer 82 of molybdenum metal and the unreacted portion of the inner layer 80 of titanium metal overlying the oxide side walls 78 are removed by chemically etching in a solution of $H_2O_2+NH_4OH+H_2O$. As shown in FIG. 2G, this chemical etch does not remove the titanium silicide regions 84, but does remove the unreacted titanium metal of the portions of inner layer 80 over the oxide side walls 78. It should be noted, that if the outer layer 82 of refractory metal were not present, the titanium in the portion of the inner layer 80 over the oxide side wall regions 78 would oxidize to form $TiO_2$ which could not be removed by such etching.

Figure 2H:
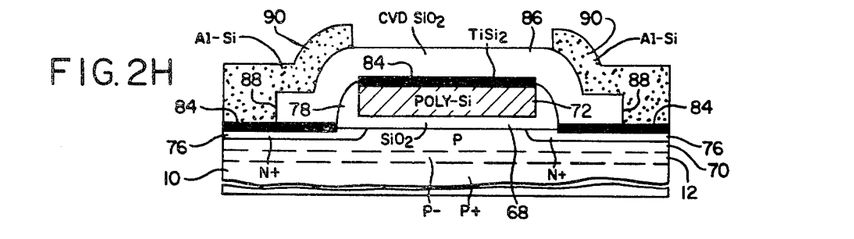

The steps shown in FIG. 2H include the chemical vapor deposition of a silicon dioxide layer 86 over the silicide regions 84 and the oxide side walls 78 for passification purposes. Next, the device is heated to about 800° C. for approximately 30 minutes to provide a high-temperature silicidation step for further production of titanium silicide in the silicide regions 84 to provide a sheet resistance of 2 to 3 ohms per square for such regions. The silicide regions 84 reduce the ohmic contact resistance and interconnection resistance of the gate region 72 and the source and drain regions 76. Contact holes 88 are etched through the oxide layer 86 above the source and drain regions 76 to the silicide regions 84 by photoresist mask etching in a conventional manner. Then, electrical contacts of an aluminum and silicon alloy are provided by sputtering through the contact apertures 88 into electrical contact with the silicide regions 84 over the source and drain elements 76. The electrical contacts 90 are spaced apart in a conventional manner by photoresist mask etching to limit the area of the metal layer 90 to that over the silicide regions 84 in contact with the source and drain elements 76. This leaves a space between the two contacts 90 for the formation of a third contact which will extend through the oxide layer 86 into contact with the silicide layer 84 over the gate region 72.

Figure 3A:
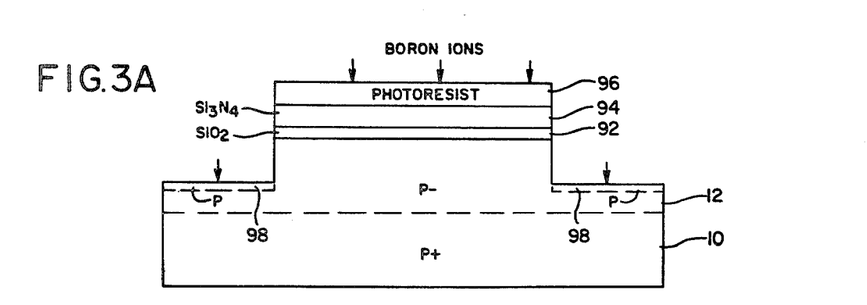
FIGS. 3A to 3G show successive steps of a third process used in the method of manufacture of the integrated circuit of the present invention for forming a bird's beak free silicon oxide insulating layer for insulated gate transistors therein.

The method of manufacture of integrated circuits in accordance with the present invention includes a third process of FIGS. 3A to 3G for forming "bird's beak" free insulated gate field effect transistors in a CMOS integrated circuit. As shown in FIG. 3A, a substrate 10 of P+ type silicon semiconductor material having an epitaxial layer 12 of P− silicon semiconductor material provided on its upper surface may be employed to form the CMOS integrated circuit. An oxide layer 92 of silicon dioxide is deposited by thermal growth on the upper surface of the epitaxial layer 12 to provide an oxide layer approximately 500 angstroms thick. A silicon nitride ($Si_3N_4$) layer 94 with a thickness of approximately 1500 angstroms is deposited on the upper surface of the oxide layer 92 by chemical vapor deposition. A photoresist mask layer 96 is formed on the upper surface of the nitride layer 94 to define the active transistor area of the epitaxial layer by conventional photolithographic techniques. Then portions of the silicon nitride layer 94, the silicon dioxide layer 92 and the epitaxial layer 12 are removed by reactive ion etching on opposite sides of the mask 96 completely through the layers 92 and 94, and to a depth of approximately 0.3 to 0.4 microns into the epitaxial layer of the substrate. It should be noted that the P− type layer 12 may be provided by the base material of the substrate 10, rather than the epitaxial layer 12. Next, P type field regions 98 are deposited by boron ion implantation into the etched regions of the upper surface of the epitaxial layer 12 on opposite sides of mask 96.

Figure 3B:
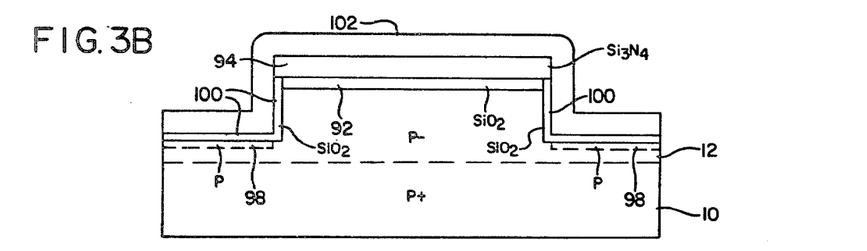

As shown in FIG. 3B, the photoresist layer 96 is then removed and an additional oxide layer 100 of silicon dioxide is provided by thermal growth on the surface portions of the epitaxial layer 12 above the P type field regions 98 and on the vertical sides of the raised portion of the epitaxial layer which extends upward above the field regions. The additional oxide layer 100 merges with the top oxide layer 92. Then a second silicon nitride layer 102 is deposited by chemical vapor deposition over the oxide layer 100 and over the first silicon nitride layer 94. This second nitride layer 102 has a thickness of about 1500 angstroms, the same thickness as the first nitride layer 94, while the additional oxide layer 100 has a thickness of about 500 angstroms, the same thickness as the first oxide layer 92.

Figure 3C:
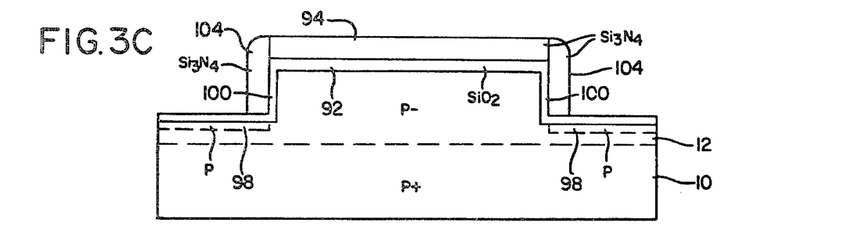
Figure 3D:
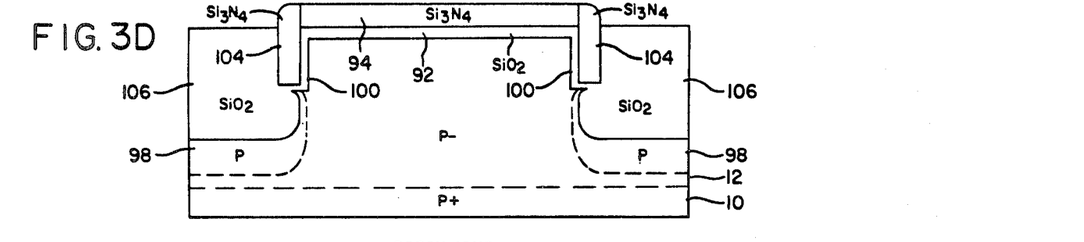

As shown in FIG. 3C, the second nitride layer 102 is removed by reactive ion etching except for side wall portions 104 which are coated over the vertical side walls of the raised portion of epitaxial layer 12 covered by the oxide layer 100, and over the ends of the first nitride layer 94. Thus, the reactive ion etching step etches anisotropically in a downward vertical direction but not horizontally to any appreciable extent. The reactive ion etching solution may be made $CHF_3 + H_2$ gas which removes silicon nitride but does not etch silicon. As can be seen in FIG. 3C, a nitride cup is formed by nitride layers 94 and 104 over the top of the raised portion of the P− epitaxial layer 12 on which the transistor is formed, as hereinafter discussed. This nitride cup prevents lateral diffusion of the oxide atoms from the silicon dioxide layer 92 which would ordinarily cause growth of "bird's beaks" by increasing the thickness of such oxide layer at the opposite ends thereof during the field oxidation step of FIG. 3D. Field oxidation regions 106 are formed by further oxidation of the portions of the oxide layer 100 over the P type field regions 98 by heating at a temperature of 1000° C. in an oxygen atmosphere. This causes thermal growth of field oxidation regions 106 of increased thickness which are approximately 6000 to 8000 angstroms thick. In addition, the thickness of the field regions 98 also increases by further oxidation due to such heating step. It should be noted that the oxide layer 100 over the field region 98 grows simultaneously upward and downward to form the field oxidation regions 106 during the step of FIG. 3D. However, the thickness of the epitaxial layer 12 does not change appreciably and the relative thickness of such epitaxial layer is only shown greater in FIG. 3D for purposes of clarity to indicate the relative positions of the integrated circuit elements.

Figure 3E:
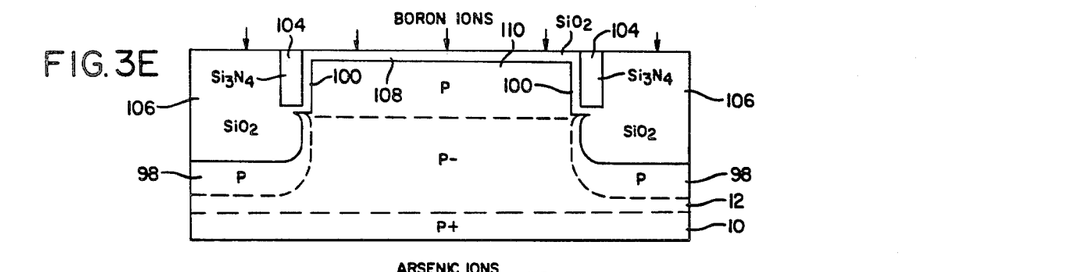

The next steps in the process are shown in FIG. 3E, and include etching to remove the silicon nitride layer 94 and the top portions of the side wall nitride layers 104 as well as removing the original oxide layer 92 in case it has become contaminated with impurities. A second gate insulation oxide layer 108 of silicon dioxide is then formed by thermal growth on the upper surface of the epitaxial layer 12 between the two spaced side wall portions 104 of silicon nitride. This second oxide layer 108 is uncontaminated and, therefore, can serve as the gate insulation layer of the field effect transistor. Next, a P type channel region 110 is formed by ion implantation in the upper surface of the epitaxial layer 12 between the two nitride side wall regions 104 and beneath the second oxide layer 108 by implanting boron or other P type impurity through such oxide layer.

Figures 3F, 3G:
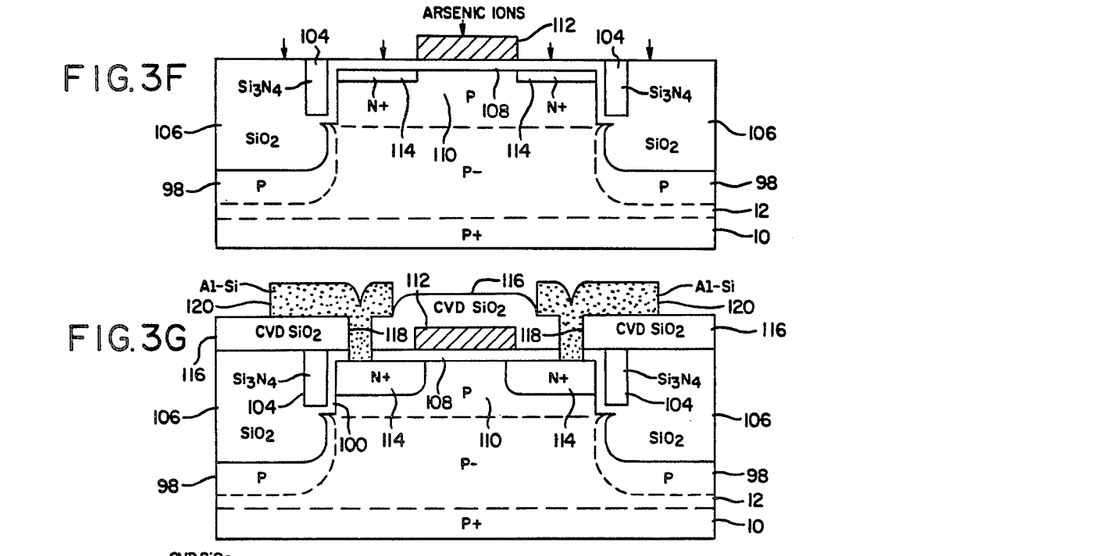

As shown in FIG. 3F, a layer 112 of polycrystalline silicon is deposited by chemical vapor deposition on the upper surface of the oxide layer 108 and is etched by conventional photoresist mask techniques to provide the gate region 112 of polycrystalline silicon. Next, source and drain regions 114 of N+ silicon conductor material are formed in the P type channel portion 110 on opposite sides of the gate 112 by ion implantation of arsenic ions. The arsenic ions also are implanted into the polycrystalline silicon gate region 112 to provide such gate region with an N type conductivity.

The final steps in the formation of a bird's beak free insulated gate field effect transistor are shown in FIGS. 3G. These steps include chemical vapor deposition of a silicon dioxide layer 116 for passification over the gate regions 112, the gate insulation layer 108 and the oxide isolation region 106. Then the semiconductor device is annealed by heating it to approximately 900° C. for about 30 minutes in an inert atmosphere of nitrogen. This causes the source and drain regions 114 to grow in thickness by diffusion. Then, a conventional photoresist mask formation and etching technique is employed to form contact holes 118 through the oxide layer 116 and the gate insulation oxide layer 108 to the source and drain regions 114. After that a metal contact 120 of aluminum and silicon alloy is deposited by sputtering through such contact openings 112 into electrical contact with the source and drain regions 114. Thus, the contacts 120 may be made of an alloy of 98.5% aluminum and 1.5% silicon formed by sputtering on the upper surface of the oxide layer 116 and through the openings 118. Photoresist etching of the metal layer 120 provides two contacts connected to the source and drain region 114 which are spaced apart for electrical insulation. This spacing enables a gate contact (not shown) to be deposited through an aperture formed in the oxide layer 116 above the gate region 112 to enable electrical contact to such gate region. However, this latter step has not been shown for purposes of clarity.

Figure 4:
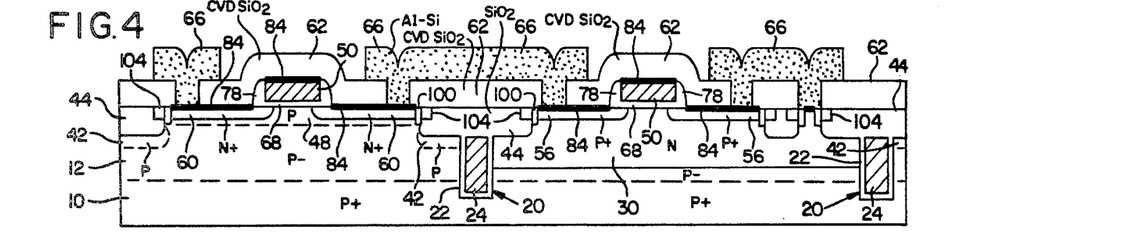
FIG. 4 is a cross-section view of a portion of an integrated circuit made in accordance with the methods of the present invention.

A CMOS type integrated circuit is shown in FIG. 4 including a plurality of pairs of complementary insulated gate field effect transistors made in accordance with the processes of FIGS. 1, 2 and 3. Reference numbers used for elements in the integrated circuit of FIG. 4 are the same as the correspoonding elements formed by the processes of FIGS. 1, 2 and 3. Thus, the integrated circuit of FIG. 4 includes a dielectric isolation region formed in the deep trench 20 having a silicon dioxide layer 22 on the inner surface of such trench and a filling 24 of polycrystalline silicon deposited over such oxide layer. The dielectric isolation region 20, 22, 24 separates an enhancement type N conductivity channel insulated gate field effect transistor including channel portion 48 on the left side of the isolation region and a P conductivity channel insulated gate field effect transistor including the N channel region 30 on the right side of such isolation region. The source and drain elements 60 and gate element 50 of the N channel field effect transistor are covered by refractory metal silicide areas 84. Similarly, the P channel insulated gate field effect transistor has its source and drain elements 56 and gate element 50 covered by refractory silicide areas 84. The side wall portions 78 of the gate insulation oxide layer 68 are free of any titanium covering layer because it was etched away before the final high temperature silicidation step in accordance with FIGS. 2G and 2H. The nitride side wall portions 104 prevent the growth of bird's beak in the oxide layer 68 which prior to etching extended over the epitaxial layer 12 where the silicidation layers 84 cover the source and drain elements 60 and 56. Since the same reference numerals have been used on the integrated circuit of FIG. 4 that have previously been employed in describing the method of manufacture of such integrated circuit with the processes of FIGS. 1, 2 and 3, no further description of such integrated circuit is believed to be necessary.

It will be obvious to those having ordinary skill in the art that many changes may be made in the above-described preferred embodiments of the present invention. Therefore, the scope of the present invention should be determined by the following claims.

We claim:

1. Process for manufacturing an integrated circuit including a plurality of insulated gate field effect transistors, comprising the steps of:
   a. forming a monocrystalline semiconductor substrate of P or N type conductivity with an epitaxial layer thereon of the same type of conductivity including a channel portion;
   b. forming a gate insulation layer of semiconductor oxide on the channel portion of said epitaxial layer;
   c. depositing a gate element of doped semiconductor material on said gate insulation layer to form therewith an insulated gate extending above the surface of the epitaxial layer;
   d. depositing source and drain elements in said channel portion of said epitaxial layer on opposite sides of said gate portion, said source and drain having opposite conductivity to said channel portion;
   e. depositing a side wall layer of semiconductor oxide on the sides of the insulated gate over ends of the gate insulation and the gate element;
   f. coating said source, drain and gate elements and said side wall layer with a double layer of refractory metal including an inner layer of a first low resistivity refractory metal of 3 ohms per square resistivity or less which when heated to a predetermined temperature forms a refractory metal compound with the semiconductor material of the source, drain and gate elements but not with the semiconductor oxide of the side wall portion, and an outer layer of second higher resistivity refractory metal which does not oxidize as readily as said inner metal, said outer layer being coated over said inner layer;
   g. heating said coated substrate at said predetermined temperature to cause said inner layer to form a refractory metal semiconductor compound with the source, drain and gate elements while oxidation of the outer surface of said inner layer is prevented by the protective covering of said outer layer;
   h. selectively etching the double layer of refractory metal to remove the outer layer and to remove portions of the inner layer from said side wall layer without removing the refractory metal semiconductor compound from the source, drain and gate elements; and
   i. forming metal contacts with the source, drain and gate elements.

2. Process of claim 1 in which the semiconductor substrate is formed of silicon and the refractory metal-semiconductor compound is a refractory metal silicide.

3. Process of claim 2 in which the inner layer of refractory metal is a metal taken from the group consisting of titanium and tantalum.

4. Process of claim 3 in which the outer layer of refractory metal is a metal taken from the group consisting of molybdenum tungsten and platinum.

5. Process of claim 2 in which the inner layer of refractory metal is of titanium, the outer layer of refractory metal is of molybdenum, and the coated substrate is heated to about 600° C. to form titanium silicide before said etching and is further heated after etching the inner layer from the side wall layer to about 800° C. for further formation of titanium silicide.

6. Process of claim 5 which also includes depositing an outer insulating layer of silicon dioxide on the titanium silicide over the source, drain and gate elements and on the side wall portion, and the metal contacts are formed by deposition through apertures in said outer insulating layer.

7. Process of claim 1 in which the gate element is formed of doped polycrystalline semiconductor material.

* * * * *